United States Patent [19]

Akimoto et al.

[11] Patent Number: 4,978,914
[45] Date of Patent: Dec. 18, 1990

[54] LAMINATED BOARD FOR TESTING ELECTRONIC COMPONENTS

[75] Inventors: Mitsuru Akimoto; Takamasa Jimbo; Kiyoshi Umemura; Haruhiko Iwase; Kenzirou Ogawa, all of Kanagawa, Japan

[73] Assignees: Furukawa Denki Kogyo Kabushiki Kaisha, Tokyo; Yamaichi Denki Kogyo Kabushiki Kaisha, both of Japan

[21] Appl. No.: 517,433

[22] Filed: Apr. 24, 1990

Related U.S. Application Data

[63] Continuation of Ser. No. 323,450, Mar. 14, 1989, abandoned.

[30] Foreign Application Priority Data

Mar. 15, 1988 [JP] Japan .................................. 63-59241
Aug. 4, 1988 [JP] Japan ................................. 63-195412

[51] Int. Cl.⁵ ........................ G01R 31/02; G01R 1/04
[52] U.S. Cl. ............................... 324/158 F; 219/209; 324/73.1
[58] Field of Search ............. 324/158 F, 158 R, 73.1; 219/209; 165/80.2, 61; 361/386, 388

[56] References Cited

U.S. PATENT DOCUMENTS

| | | | |
|---|---|---|---|
| 3,656,058 | 4/1972 | Leathers | 324/158 F |
| 4,460,868 | 7/1984 | Schmitt et al. | 324/158 F |
| 4,771,236 | 9/1988 | Banks | 324/158 F |
| 4,777,434 | 10/1988 | Miller | 324/73 PC |
| 4,839,587 | 6/1989 | Flatley et al. | 324/158 F |

Primary Examiner—Ernest F. Karlsen
Attorney, Agent, or Firm—Michael N. Meller

[57] ABSTRACT

An electronic component testing laminated board suitable for performing a heat test on electronic components of a multikind and small quantity production type. The laminated board includes a metal plate, a testing circuit layer including a double-sided printing wiring board or the like and integrally formed through a thin electric insulating layer on one side of the metal plate for mounting thereon electronic components to be tested, and a heater circuit layer including a metal foil circuit or the like and integrally formed through another electric insulating layer on the other side of the metal plate for maintaining the testing circuit layer at a given temperature. An inorganic filler or the like is added to the electric insulating layers. An electronic component testing box for removably accommodating the electronic component testing lamianted board includes walls made of a heat insulating material, power supply connecting connector, signal input and output connector, temperature measuring apparatus, etc.

33 Claims, 10 Drawing Sheets

LAMINATED BOARD FOR TESTING ELECTRONIC COMPONENTS

This application is a continuation of application Ser. No. 323,450, filed March 14, 1989, now abandoned.

BACKGROUND OF THE INVENTION

The present invention relates to a laminated board for testing electronic components which is used when performing a burn-in test for maintaining electronic components such as ICs at a given temperature for a fixed period of time to evaluate the reliability of the electronic components, and more particularly the invention relates to a laminated board for testing electronic components which is capable of efficiently and accurately testing electronic components of the multikind and small quantity production type.

Recent tendency toward greater miniaturization and higher density of electronic components has been so remarkable that the functions and performances of electronic components have been enhanced considerably. For the evaluation of mass-produced electronic components, however, it is important to determine whether they are not only excellent in function and performance but also stabilized and standardized in quality. As a result, at the end of the fabrication steps of many electronic components, a burn-in test for maintaining the fabricated electronic components at a given high temperature for a given period of time to check their electric characteristics in performed with a view to determining the quality of the products and ensuring stabilization of the quality of the products. Also, in response to the reduction in the period of development of electronic components, there has been a demand for evaluating in a short period of time the reliability with respect to the functions and performances of various newly developed electronic components.

In the past, the burn-in test for reliability evaluation purposes has been performed by leaving a test board carrying thereon electronic components to be tested at rest in a thermostatic chamber preset to a given temperature. At this time, if the temperature distribution within the test chamber is not uniform, it is impossible to attain the objective of the test, that is, to ensure the standardization of quality, and therefore various contrivances for maintaining the chamber temperature constant have been made. Generally, such methods have been used that the chamber is increased in wall thickness and size to increase the chamber heat capacity and thereby to reduce the fluctuations in temperature and that the air within the chamber is forced to circulate to reduce the temperature variations among different portions within the chamber.

However, these methods have been disadvantageous in that not only the test chamber becomes a very large-scale unit with the resulting increase in the equipment cost but also much time is required for the desired temperature rise, with the result that in order to perform the burn-in test in accordance with the fabrication steps, the test chamber must always be operated continuously at a given temperature and the resulting loss is large. There is another inconvenience that each time the test is performed, the temperature profile of the test chamber is varied depending on the number of electronic components to be tested, etc.

Moreover, in view of the supply trend of ICs, while the main trend in the past has shown a multikind and mass production tendency toward mass-producing ICs of rated characteristics and allowing users to use these ICs in various combinations, the recent trend has been changing over to a multikind and small quantity production tendency centering on such kinds of ICs each intended for a particular user and having the functions of a large number of conventional general-purpose ICs, e.g., an ASIC (application specific integrated circuit) that is called for example as a gate-array IC or custom IC. Also, in the development of new ASICs designed for particular users, the development department of such ICs is required to perform tests at the laboratory stage prior to its production on the line and in this case the tests are performed on a minimum number of samples. In addition, the actual circumstances are such that almost all the OA equipment makers perform again the burn-in test after the purchasing of ICs with a view to ensuring the reliability of the ICs.

In these circumstances, while the previously mentioned test employing a thermostatic chamber is suited for performing the burn-in test on a large number (e.g., several thousands) of electronic components such as ICs at a time, a problem has arisen that where it is desired to perform the burn-in test on several to several tens electronic components at a time as occasion demands, the test efficiency of this test method is very low and it is also difficult to make stable measurements.

As an electronic component testing laminated board designed to overcome these problems, there has been known a so-called heater printed wiring board having a planner heater element. As shown by the sectional view of FIG. 4, it is constructed by laminating electric insulating layers 205a and 205b composed by epoxy glass-cloth sheets to both sides of a planner carbon-graphite heater element 203 and then bonding the laminate to a testing circuit layer 202 (copper foil circuit 202a) formed by the same procedure are used in the fabrication of the ordinary printed wiring board. Also, formed at the end portions of the carbon-graphite heater element 203 held between the electric insulating layers 205a and 205b are terminal portions from which leads are brought out to the outside and the leads 211 are connected to a power source. When performing the test, a current is supplied to the carbon-graphite heater element 203 whose electric resistance value is large as compared with metal conductors so that a considerable amount of joule heat is generated and this heat is transmitted to the testing circuit layer 202 through the electric insulating layer 205a, thereby increasing the temperature of the testing circuit layer 202 to a given temperature.

However, this type of conventional electronic component testing laminated board is disadvantageous in that since a heater element laminated to a testing circuit layer is held between electric insulating layers which are low in heat conductivity and thick, the transmission of heat to the testing circuit layer is slow, that is, not only the temperature rise is slow but also the dispersion of the heat from the heater element does not take place rapidly, thus tending to cause a local high temperature portion and thereby making it difficult for the temperature distribution on the surface of the testing circuit layer to become uniform.

In addition, although it is reinforced by the glass cloth, the large part of the board is composed of an organic material and therefore its mechanical strength is low. (The electric insulating layers cannot be made very thin from the viewpoint of mechanical strength thereof.) Also, as mentioned previously, the heat generated from the heater element tends to be retained in the electric insulating layers and thus the epoxy resin forming the electric insulating layers tend to be deteriorated by the heat. As a result, the continuous maximum working temperature is as high as 120° C. at the surface of the testing circuit layer and thus the board cannot be used in the burn-in test under the conditions of 150° C. and 125° C. which are determined by the JIS specifications. There is another disadvantage that during the test the board is deformed due to the differences in thermal expansion coefficient among the respective layers and it cannot regain its original size and shape.

There is still another disadvantage that there are cases where the ICs or the like subjected to the test are operated erroneously by the electromagnetic noise produced during the on-off operation of the heater circuit layer, thus making it impossible to accurately evaluate the reliability.

SUMMARY OF THE INVENTION

The present invention has been made in view of the foregoing deficiencies in the prior art and it is a first object of the invention to provide an electronic component testing laminated board which is well suited for testing electronic component of the multikind and small quantity production type, in which a testing circuit layer is fast in temperature rise, uniform in temperature distribution and excellent in mechanical strength and which is capable of preventing the effect of noise from a heater circuit layer.

It is a second object of the invention to provide an electronic component testing box for accommodating such electronic component testing laminated board to more easily and accurately perform a heat test on electronic components of the multikind and small quantity production type.

An electronic component testing laminated board of this invention is so constructed that a metal plate is integrally formed on one side with a testing circuit layer for mounting thereon electronic components to be tested through an electric insulating layer and on the other side with a heater circuit layer for maintaining the testing circuit layer at a given temperature through an electric insulating layer.

It is to be noted that in the description of the specification of this invention, the term "integrally formed" is meant to include all of those cases where separately prepared testing and heater circuit layers are each laminated to a metal plate through an electric insulating layer to be integral therewith, where each circuit layer is formed by etching a metal foil preliminarily bonded to a metal plate through an electric insulating layer and where each circuit layer is formed by printing a conductive paste or applying an electroless plating to an electric insulating layer preliminarily laminated to a metal plate.

Also, an electronic component testing box of this invention comprises box means having an opening which can be closed and it is adapted to removably accommodate the previously mentioned electronic component testing laminated board. Preferably, the box means includes partition walls composed of heat insulating material, power supply connecting connector, signal input and output connector means, temperature measuring means, etc.

In accordance with the invention, interposed between the heater circuit layer and the testing circuit layer is the metal plate having a high heat conductivity (e.g., the heat conductivity of aluminum is 480 cal/cm.sec.° C. as compared with 0.8 cal/cm.sec.° C. of an epoxy resin sheet reinforced with a glass cloth) so that the heat generated from the heater circuit layer and transmitted to the metal plate through the electric insulating layer is dispersed rapidly in the metal plate and the dispersed heat is very rapidly and uniformly transmitted to the testing circuit layer laminated through the electric insulating layer to the other side of the metal plate. In other words, this has the effect of setting the testing circuit layer to the desire temperature in a short period of time and very greatly reducing the variations in temperature among the different locations. Also, in accordance with the invention, since the heat generated by the heater circuit layer is rapidly dispersed into the metal plate, there is no danger of the temperature of the heater circuit layer being increased partially to a very high temperature and thus the testing circuit layer can be set to a higher temperature than previously without any damage by the heat (e.g., deterioration of the constituent resin) to the heater circuit layer. These effects of the invention can be enhanced further by making the thickness of each electric insulating layer thin and uniform (preferably about 60 to 150 μm) so far as the desired insulation resistance value is ensured and adding filler having good heat conductivity, thereby improving the heat conductivities of the electric insulating layers. The thickness of the metal plate should preferably have a certain thickness to ensure a constant heat quantity from the standpoint of performing a role as a heat sink. If the thickness of the metal plate is made too thicker, it takes much time to heat the metal plate itself and also the weight of the metal plate is increased, which makes it difficult to treat it easily. Therefore, it is desirable to make the thickness of the metal plate to be 0.5 to 3 mm, if possible, to be 1 to 2 mm.

Further, the electronic component testing laminated board of this invention is improved remarkably in mechanical strength than previously due to the interposition of the metal plate (the thickness of the metal plate should preferably be made to be 0.5 to 3 mm, if possible, to be 1 to 2 mm, from the viewpoint of ensuring its mechanical strength), has no danger of being damaged or deformed during the ordinary tests an is excellent in durability.

Still further, in accordance with the invention a shielding layer composed for example of a metal foil, conductive paste or the like is disposed on the outer side of the heater circuit layer through an electric insulating layer and it is also conductively connected to the metal plate and to the ground, thereby easily eliminating the ill effect of the electromagnetic noise from the heater circuit layer.

Then, if the electronic component testing laminated board of the invention is used by accommodating it in the electronic component testing box of the invention, it is possible to more easily and more accurately perform the test in any place at the desired time.

Features and advantages of the invention will be more clearly understood from the following description of its preferred embodiments taken in conjunction with the accompanying drawings.

DESCRIPTION OF THE PREFERRED EMBODIMENTS

EMBODIMENT 1

Figure 1:
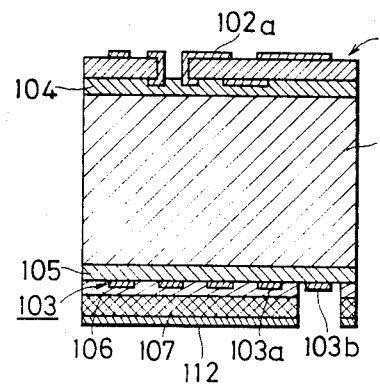
FIG. 1 is a sectional view showing the construction of an electronic component testing laminated board according to an embodiment of the present invention.

Referring to FIG. 1, there is illustrated a sectional view showing the construction of an electronic component testing laminated board according to an embodiment of the present invention. In this embodiment, a double-side copper-clad epoxy glass-cloth substrate having a thickness of 0.5 mm (the copper foil are 35μ) is first used as a testing circuit layer 102 and a copper foil circuit 102a is formed by etching, thereby preparing a printed wiring board formed with through holes and having a size of 210 mm ×297 mm.

Figure 4:
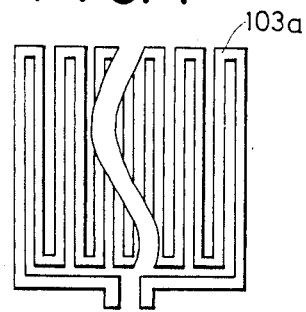
FIG. 4 is a plan view representing the shape of a copper foil circuit of a heater circuit layer in an embodiment of the present invention.

Then, a metal plate 101 composed of aluminum and having a thickness of 1.5 mm is clad with a copper foil through an electric insulating layer 105 to prepare a copper-clad aluminum base CUPRIMID CBN 1535 (Tradename: manufactured by Furukawa Denki Kogyo, Co., Ltd.) and the copper foil (35 μm) is etched to form a copper foil circuit 103a as a heater circuit layer 103. The copper foil circuit 103a should preferably be etched for example in a zigzag pattern all over the portion corresponding to the testing circuit layer 102 so as to increase its circuit length (for the purpose of generating the required joule heat). In this embodiment, as shown in FIG. 4, there is provided and stretched in a zigzag line a copper foil circuit 103a having a width of 1.0 mm and a length of 14,660 mm (the pattern width of the figure is made broader than the ratio of the actual measurement) and at the both end of which terminals are arranged respectively. The total consumption of power of this copper foil circuit 103a per unit are of 50V was 0.4 W/cm². The shape of the heater circuit, any shape other than that shown in FIG. 4 will of course be employable, should be established in the pattern width, spacing and the like so that the consumption of power per unit area may become 0.3 to 0.5 W/cm². As in the case of this embodiment, by etching the metal foil preliminary bonded to the metal plate to form the heater circuit layer, the thickness of the electric insulating layer 105 can be made thin and uniform and this is preferable from the standpoint of rapidly transmitting the heat generated by the heater circuit layer to the metal plate. Also, in this embodiment the electric insulating layer 105 is added with a good-conductivity inorganic filler in such an amount that will not ruin the adhesion power of the electric insulating layer 105, thereby improving the heat conductivity of the electric insulating layer.

Also, an epoxy glass-cloth sheet (so-called prepreg) prepared by impregnating a glass cloth with an epoxy resin and semi-curing it and having a thickness of 0.13 mm is used as an electric insulating layer 104 laminated between the metal plate 101 and the testing circuit layer 102. It is desirable that the thickness of the electric insulating layer should be made to be about 60 to 150 μm, considering the both characteristics of the withstand voltage and the heat conductivity, and especially the thickness of the electric insulating layer between the metal plate and the heater circuit layer should be made 75 to 85 μm.

Also, in this embodiment, to prevent any deformation of the laminated board during the heat generation due to the difference in thickness between the testing circuit layer 102 and the heater circuit layer 103 and to prevent the generation of noise from the heater circuit layer 103, a single-side copper-clad epoxy glass-cloth substrate (an electric insulating layer 107 and an electromagnetic shielding layer (copper foil) 112) of the same thickness (0.5 mm) as the testing circuit layer 102 is arranged on the outer side of the heater circuit layer 103 through an electric insulating layer 106 composed of an epoxy glass-cloth sheet of 0.13 mm thick. The electric insulating layer 106 and the single-side copper-clad epoxy glass-cloth substrate are preliminarily cut out at the corresponding portion so as to expose terminal portions 103b of the heater circuit layer 103.

Figure 3A:
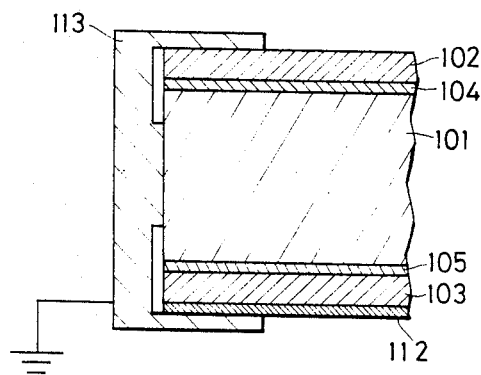
FIGS. 3A and 3B are sectional views for explaining the conductive connections between the metal plate and the shielding layer.

In this embodiment, the above-mentioned layers are thermo-compressed by a vaccum press by the use of an apparatus similar to one used for fabricating multi-layer printed wiring boards and then a conductive connection (not shown) is provided between the metal plate 101 and the shielding layer 112, thereby producing an electronic component testing laminated board of the stacked structure as shown in FIG. 1. The method of conductively connecting the metal plate 101 and the shielding layer 112 may for example be a substantially E-shaped conducting jig 113 which is fitted on the end portion of the laminated board as shown in FIG. 3A or alternatively a metal screw 114 may be threaded through the laminated board. When using this electronic component testing laminated board, the conducting jig 113 or the screw 114 is connected to the ground and in this way the effect of noise from the heater circuit layer 103 can be completely eliminated.

EMBODIMENT 2

Figure 2:
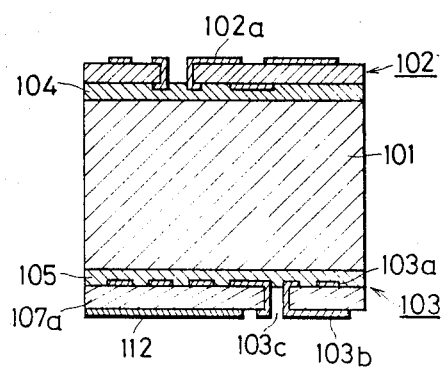
FIG. 2 is a sectional view showing the construction of an electronic component testing laminated board according to another embodiment of the invention.

Referring to FIG. 2, there is illustrated a sectional view showing the construction of an electronic component testing laminated board according to another embodiment of the invention. The electronic component testing laminated board of this embodiment is the same in construction with the first embodiment in that the testing circuit layer 102 is laminated to the metal plate 101 through the electric insulating layer 104 and only the construction of the heater circuit layer 103 differs from the counterpart of the first embodiment.

Figure 3B:
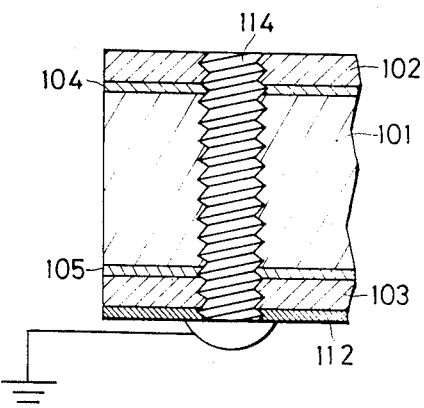

In this embodiment, using a double-side copper-clad glass-cloth substrate (an electric insulating layer 107a) having a thickness of 0.5 mm, a copper foil circuit 103a forming the heater circuit layer 103 is formed on one side by the subtractive method and terminal portions 103b connected to the copper foil circuit 103a via through holes 103c and a shielding layer 112 are formed on the other side. Then, the thus prepared double-side printed wiring board is arranged, with the heater circuit layer 103 on the inner side, on the outer side of the metal plate 101 composed of aluminum of 1.5 mm thick through the electric insulating layer 105 composed of an epoxy glass-cloth sheet as in the first embodiment and then the respective layers are thermo-compressed by a vacuum press as in the first embodiment, thus forming an electronic component testing laminated board such as shown in FIG. 2. The metal plate 101 and the shielding layer 12 are conductively connected by threading the screw 114 through the laminated board as shown in FIG. 3B.

It is to be noted that the electric insulating layer 105 laminated between the metal plate and the heater circuit layer is not limited to the epoxy glass-cloth sheet and it may be one in film form or it may be composed for example of any other resin such as polyimide. However, it is desirable that a suitable contrivance is made so that the insulating layer 105 has an improved heat conductivity by for example adding a filler as mentioned previously. The same applies to the electric insulating layer 104 laminated between the metal plate and the testing circuit layer.

Also, in this embodiment the heater circuit layer 103 itself is formed on the surface of the substrate composed of the same material of the same thickness as in the case of the testing circuit layer 102, so that their thermal expansions during the heat generation are balanced and there is no need to bond a separate substrate to the outer side of the heater circuit layer 103 for deformation preventing purposes as in the case of the first embodiment.

EMBODIMENT 3

This embodiment is the same in construction with the first embodiment shown in FIG. 1, and a glass-cloth epoxy sheet having no copper foil is bonded as an electric insulating layer to the outer side of the heater circuit layer 103. Then, a copper paste FACP (Tradename: manufactured by Furukawa Denki Kogyo Co., Ltd.) is printed by using a Tetron (polyester fiber) screen printing plate (200 mesh) and it is then cured, thereby forming a shielding layer. When the shielding layer is provided by such conductive paste, it is possible to prevent the erroneous operation of ICs due to electromagnetic noise from the heater circuit layer as in the case of the shielding layer composed of copper foil.

It is to be noted that while, in the above-described first, second and third embodiments, the testing circuit layer is formed by laminating to the metal plate a multi-layer (two layers) printed wiring board with through-holes which has been prepared separately by the substractive method, the testing circuit layer according to the invention is not limited thereto and it may be formed by laminating a printed wiring board having its circuitry formed by the additive method, the semi-additive method or the like. Also, where the testing circuit layer 102 of the single layer structure is desired, it may be formed by etching a metal foil preliminarily bonded to the metal plate 101 through the electric insulating layer 104. Depending on circumstances, only the electric insulating layer 104 is preliminarily laminated to the metal plate 101 and the desired circuit is formed by using a conductive paste or the like. On the other hand, in addition to the etching of the metal foil to form the heater circuit layer 103, it may be formed by using a conductive paste or resistive paste having a good heat resistance.

Also, while the epoxy glass-cloth substrate is used for the testing circuit layers in the first and third embodiments and the testing circuit layer and the heater circuit layer in the second embodiment, it is needless to say that the suitable substrates for use in this invention are not limited to it and any other substrate having a heat resistance capable of withstanding the burn-in test, such as, a polybutadiene substrate, polyimide substrate, teflon substrate or bismaleimide triazine substrate may be used. Also, the suitable materials for the metal plate and the metal foil are not limited to aluminum and copper, respectively, so that the metal plate may be made of iron or the like and the metal foil may be made of nickel or the like. In addition, while the copper paste is used for forming the shielding layer in the third embodiment, the paste is not limited to the copper paste and any other conductive paste such as the commercially available silver paste or carbon paste may be used.

EXPERIMENTS

Measurement of testing circuit layer surface temperature

Figure 5:
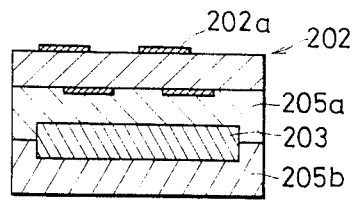
FIG. 5 is a sectional view of a conventional testing laminated board for explaining the construction thereof.
Figure 6:
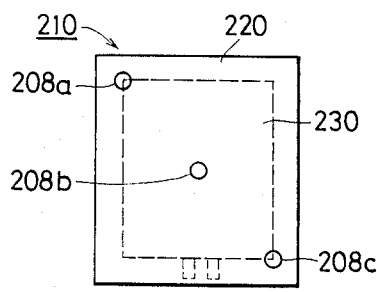
FIGS. 6 and 7 are respectively plan and sectional views useful for explaining a test method for measuring the temperatures at the surface of the testing circuit layer.
Figure 7:
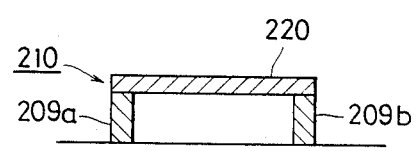

Using the electronic component testing laminated boards produced according to the first and second embodiments and the previously mentioned conventional heater printed wiring board (MC8703: manufactured by Micro Denshi Kogyo K. K.) serving as a comparative example, the surface temperatures of each testing circuit layer at the various lapsed times from the start of the current supply to the heater circuit layer were measured by means of the thermocouple CC (type 7V13: manufactured by Nihon Denki San-ei K. K.). In the heater printed wiring board served as a comparative example, whose size and thickness were 90 mm×93 mm and 1.2 mm respectively, each thickness of carbon-graphite heater element (203, FIG. 5), electric insulating layers (205a, 205b, FIG. 5) holding said heater element there between, the testing circuit layer (202, FIG. 5) was 250 to 300 μm, and the thickness of copper foil circuit (202a, FIG. 5) was 35 μm. As shown in FIG. 7, each of the test boards 210 was mounted to extend over supports 9a and 9b with surface of a testing circuit layer 220 on top and the measurements were made at the room temperature in a wideless condition. The measurement was taken as shown in FIG. 6 at the both ends on the diagonal line and the surface of the testing circuit layer 220 corresponding to the cental portion (208a, 208c, 208b) of the fabricated portion of heater element 230 (the fabricated portion of copper foil circuit 103a of the heater circuit layer in case of this invention, and the fabricated portion of carbon-graphite heater element in case of the comparative example).

Figure 8:
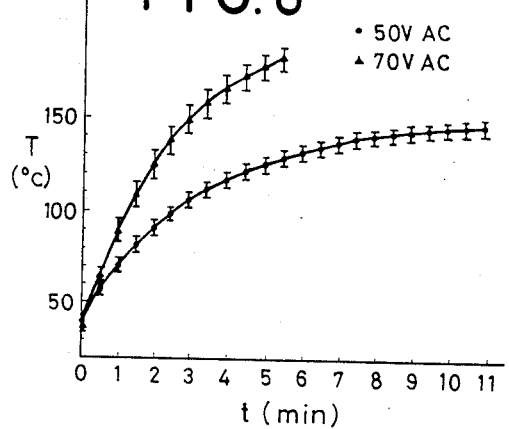
FIG. 8 and 9 are graphs (the axis of ordinates represents temperature T and the axis of abscissas time t respectively) showing the results of the temperature measurements at the surfaces of the testing circuit layers in the electronic component testing laminated boards according to the embodiments of the invention.
Figure 9:
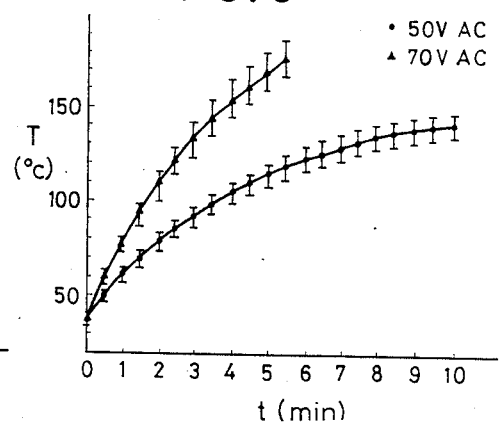
Figure 10:
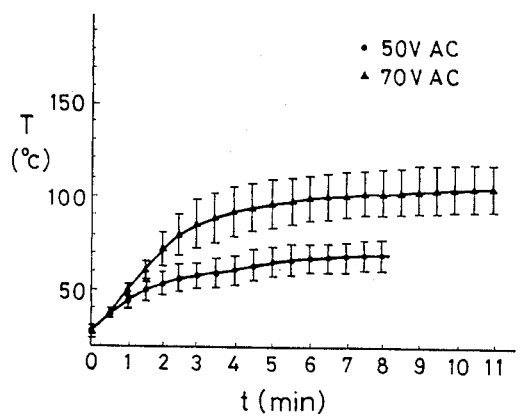
FIG. 10 is a graph (the axis of ordinates represents temperature T and the axis of abscissas time t respectively) showing the results of the temperture measurements at the surface of the testing circuit layer in a comparative laminated board.

FIGS. 8 and 9 show respectively the results of measurement of the temperature at the surfaces of the testing circuit layers effected at intervals of 30 seconds in response to the application of AC voltages of 70 and 50 volts to the heater circuit layers of the electronic component testing laminated boards according to the first and second embodiments, and FIG. 10 shows the results of measurement of the surface temperatures made by applying the voltages to the heater element of the conventional heater printed wiring board under the same conditions. Also, Tables 1 and 2 show the results of comparison of the temperature rise rates up to the lapse of 5 minutes after the application of the voltages in the respective cases, and Table 3 shows the results of comparison of the equilibrium temperatures and the temperature differences among the measuring locations in the respective cases.

TABLE 1

| | Applied voltage, 70 V (AC) | | |
| --- | --- | --- | --- |
| Elapsed time, min | Embodiment 1 | Embodiment 2 | Unit (°C./sec) Comparative example |
| 0-1 | 0.850 | 0.700 | 0.367 |
| 1-2 | 0.600 | 0.567 | 0.367 |
| 2-3 | 0.417 | 0.400 | 0.217 |
| 3-4 | 0.330 | 0.300 | 0.117 |
| 4-5 | 0.250 | 0.217 | 0.050 |

TABLE 2

| | Applied voltage, 50 V (AC) | | |
| --- | --- | --- | --- |
| Elapsed time, min | Embodiment 1 | Embodiment 2 | Unit (°C./sec) Comparative example |
| 0-1 | 0.517 | 0.417 | 0.250 |
| 1-2 | 0.333 | 0.317 | 0.133 |
| 2-3 | 0.250 | 0.230 | 0.100 |
| 3-4 | 0.200 | 0.200 | 0.005 |
| 4-5 | 0.133 | 0.130 | 0.003 |

TABLE 3

| | Applied voltage, 50 V (AC) | | |
| --- | --- | --- | --- |
| | Embodiment 1 | Embodiment 2 | Unit (°C.) Comparative example |
| Equilibrium temperature | 155 | 155 | 68 |
| Temperature difference* | 8 | 13 | 25 |

*maximum temperature difference among measuring locations

From a comparison between the graphs of FIGS. 8 and 9 showing the measurement results of the embodiments of the invention and the graph of FIG. 10 showing the measurement results of the conventional heater printed wiring board it will be seen that the testing circuit layer fabricated surfaces of the electronic component testing laminated boards according to the invention are very fast in temperature rise rate and reduced in temperature variations among the measuring locations as compared with the conventional board. This fact is substantiated by Tables 1 to 3 showing that the temperature rise rates of the boards according to the invention are two to three times those of the conventional board in both cases of the applied AC voltages of 50V and 70V and also the temperature differences among the measuring locations are about one half that of the conventional board. The equilibrium temperatures resulting from the application of an AC voltage of 50V to the electronic component testing laminated boards according to the invention are higher than that resulting from the application of an AC voltage of 70 V to the conventional board and these testing laminated boards meet the test conditions of JIS, that is, almost of the test conditions of C7021 (individual semi-conductor devices) and C7022 (semi-conductor circuits) have the maximum rate temperature of 125° C. or 150° C., and almost of the test conditions of C5102 (fixed condensors), C5202 (fixed resistor) and C5261 (variable resistors) have the maximum rate temperature of 125° C. or 155° C.

Also, a comparison between the first and second embodiments shows that the first embodiment is higher in temperature rise rate, that is, the temperature rises faster than in the case of the second embodiment as will be seen from Table 2 and 3. This is considered due to the fact that the heater circuit layer is formed by etching the metal foil bonded to the metal plate through the thin electric insulating layer containing the filler of good heat conductivity thereby ensuring the rapid transmission of heat.

It is to be noted that in order to make faster the temperature rise and make more uniform the temperature distribution of the testing circuit layer, it is preferable to perform the burn-in test or the like by enclosing the electronic component testing laminated board according to the invention in a heat insulating case or the like.

The electronic component testing laminated board according to the invention is not only well suited for efficiently performing the burn-in test on ICs and the like but also applicable for the measurement of the temperature characteristics of resistors, capacitors and the like in addition to the burn-in test.

EMBODIMENTS 4

Referring now to FIGS. 11 to 21, a description will be made of another embodiment of the invention which is designed so that the electronic component testing laminated board according to the invention is accommodated in a portable closed box and the test is performed within the box.

A portable closed box 2 includes an electronic component testing laminated board 30 which is removably horizontally mounted and supported within the closed space of the box 1, a cover member 2 composed of a wide panel (hereinafter referred to as a front panel) facing the electronic component mounting surface of the electronic component testing laminated board 30 and forming an opening 50 for measuring operation, and standoffs 25 fitted to the wide rear panel opposing the cover member 2 so as to support the portable closed box 1 in a raised position from the floor. The standoffs 25 should preferably be made from a material having electric insulating and heat insulating properties.

The cover member 2 is provided with a gripping member 27 such as a button or knob for conveniently performing the opening and closing operations of the cover member 2.

As mentioned previously, the electronic component testing laminated board 30 is arranged so as to face the cover member 2 and the burn-in test is performed in a condition where the box 1 is placed on the top of a desk or the like by means of the standoffs 25. When placed on the desk top, the electronic component testing laminated board 30 and the cover member 2 are positioned horizontally so that the cover member 2 is arranged to face the upper surface or the electronic component mounting surface of the electronic component testing laminated board 30 and the opening of the cover member 2 sets free the space above the electronic component mounting surface, thereby forming the measuring operation opening 50.

The box 1 is provided with a handle 5 composed of a grip or belt at its suitable position, preferably on the narrow side panel adjoining the front panel thus permitting to grip the handle 5 to carry the box 1 to a test place anytime, and also another standoffs 26 are fitted to the narrow side panel opposing the panel provided with the handle 5 so that the box 1 is carried by means of the handle 5 and it is positioned in place by the standoffs 26 during the time other than the test period.

On the side of the front panel forming the cover member 2, the portable closed box 1 has substantially the same size as the external shape of the electronic component testing laminated board 30 for mounting electronic components 45 and it is relatively thin-walled on the side panel sides.

Disposed inside the closed space of the box 1 closed by the cover member 2 are laminated board supporting means for removably horizontally mounting the electronic component testing laminated board 30 and connecting means for a power source which supplies current to a heater circuit pattern 35 of the electronic component testing laminated board 30.

Figure 13:
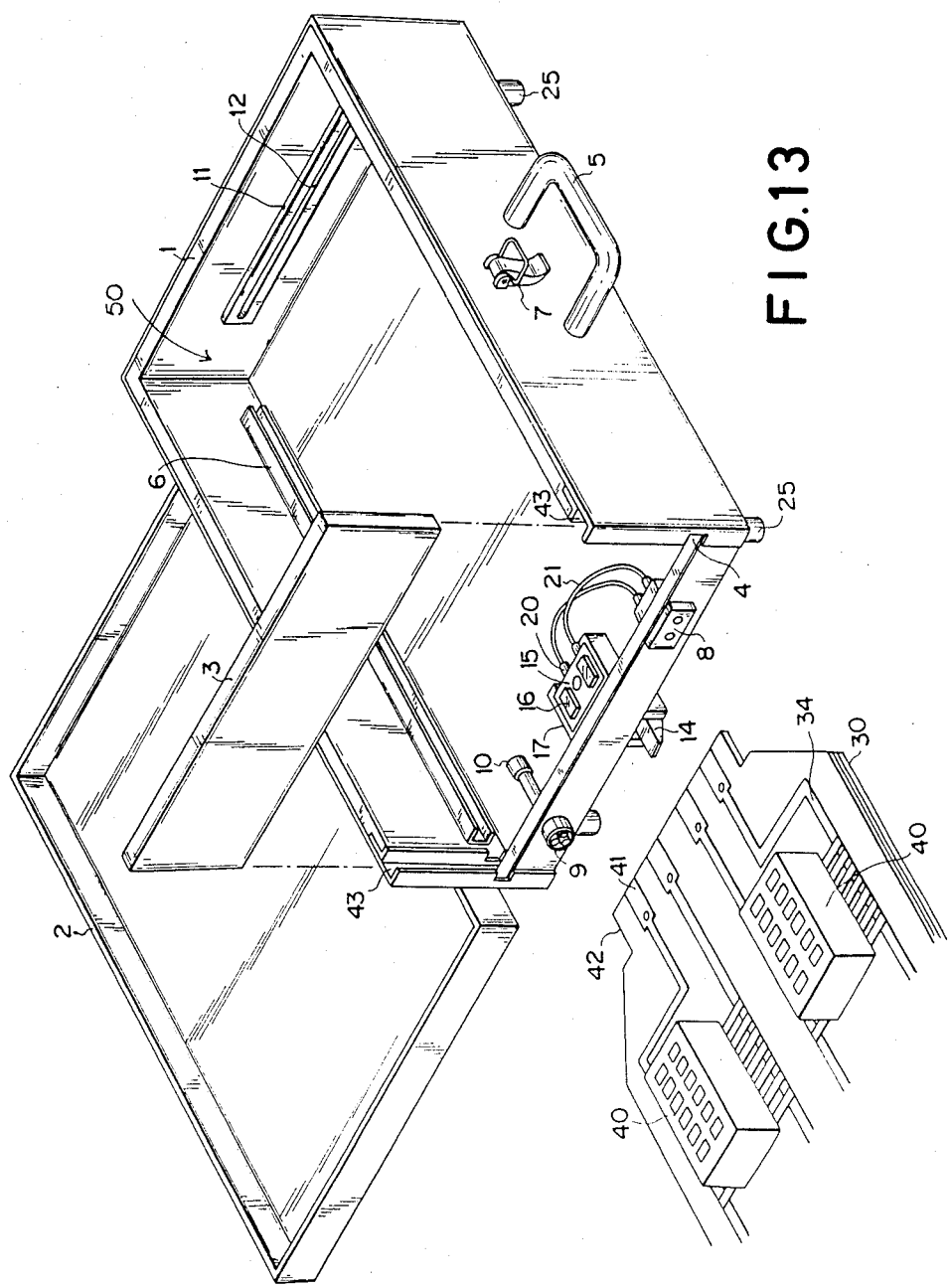
FIG. 13 is a perspective view showing the internal structure of the box.
Figure 14:
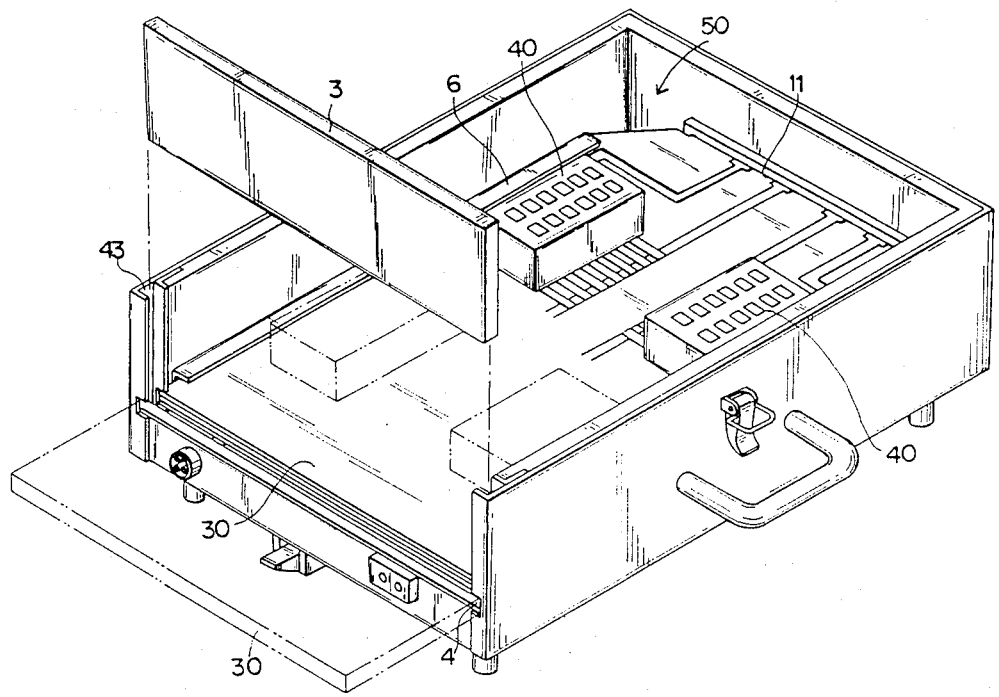
FIG. 14 is a perspective view of the box showing the condition in which the electronic component testing laminated board is mounted inside the box.
Figure 15:
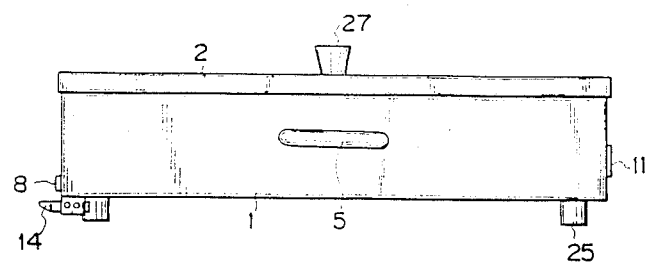
FIG. 15 is a plan view of the box.

As an example, the laminated board supporting means is formed by a pair of guide rails 6 as shown in FIG. 13. The guide rails 6 are extended parallelly along the inner surfaces of the pair of side panels of the closed box 1 which are opposite to the thickness of the electronic component testing laminated board 30 so that the electronic component testing laminated board 30 is guided by the rails 6 so as to be inserted from one ends of the rails 6 into the box 1 and the edge portions of the electronic component testing laminated board 30 are engaged with the rails 6, thereby supporting it in a horizontally mounted position within the box 1.

Figure 11:
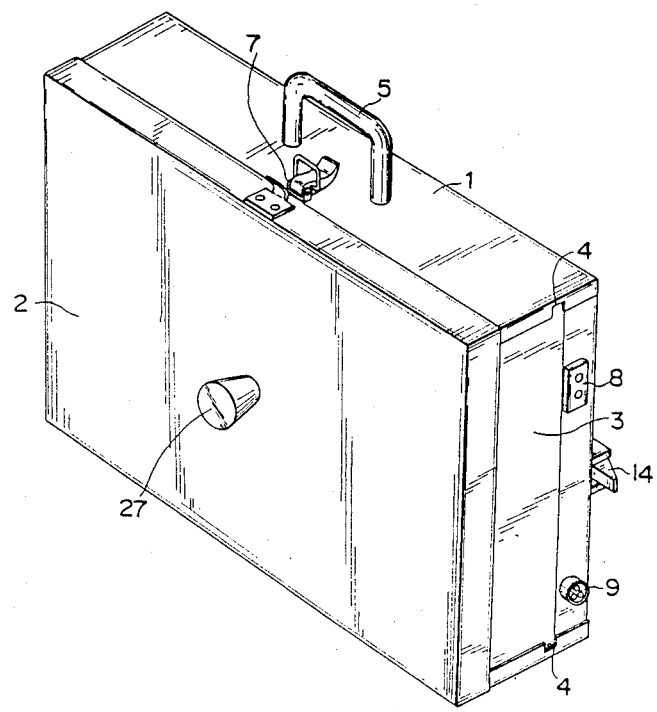
FIG. 11 is a perspective view showing the external structure, as viewed from the front panel, of a portable-type box in which is accommodated the electronic component testing laminated board according to the invention.

A gate plate 3 is formed by the side plate on one end-side of the guide rails 6 as a means of inserting the electronic component testing laminated board 30 into the box 1. The gate plate 3 can be moved in and out to the side of the front panel forming the cover member 2 and thus to permit the gate 3 to move in and out, a pair of opposing guide grooves 43 are each formed at one end of each of the side panels provided with the guide rails 6 so as to extend perpendicularly to the direction of extension of one of the guide rails 6. The entries of the guide grooves 43 are closed by the cover member 2 so that when the cover member 2 is opened, the guide grooves 43 are opened to permit the electronic component testing laminated board 30 to be moved in and out. An insertion opening 4 for the electronic component testing laminated board 30 is formed at one end of each guide rail 6 so as to be positioned in the extending area of one of the guide grooves 43, so that the electronic component testing laminated board 30 can be moved into and out of the guide rails 6 by opening the cover member 2 and removing the gate plate 3 from the guide grooves 43 thereby setting the laminated board insertion openings 4 and one side of the box 1 in an open condition as shown in FIG. 13, whereas by inserting the gate plate 3 into the guide grooves 43, the laminated board insertion openings 4 are closed thereby preventing the inflow and outflow of the gas inside the box 1 as shown in FIG. 11.

Figure 12:
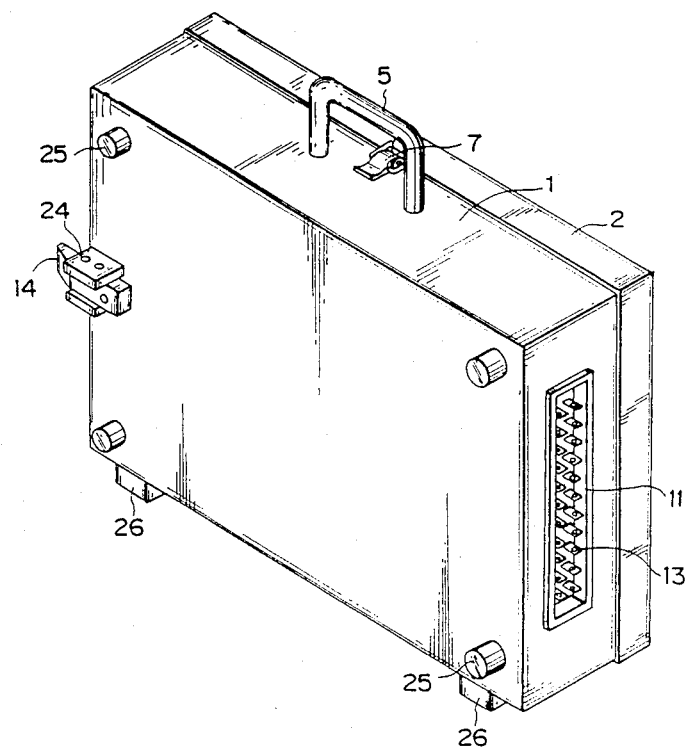
FIG. 12 is a perspective view showing the external structure of the box as viewed from the back panel.

Also, as shown in FIG. 12 an 13, a connector unit 11 is provided in the side panel opposite to the gate plate 3 so as to be positioned at the end opposite to the board insertion openings 4 of the guide rails 6 and signals are inputted and outputted from a testing circuit pattern 34 of the electronic component testing laminated board 30 through the connector unit 11. The connector unit 11 is formed with an insertion slot 12 for the electronic component testing laminated board 30 which is opened to the interior of the box 1 and contacts 13 exposed to the outer side of the box 1 so as to input and output signals. When the electronic component testing laminated board 30 is inserted into the guide rails 6 as mentioned previously, a connecting plate 42 extended from the end of the laminated board 30 is inserted into the laminated board insertion slot 12 at the insertion end of the board 30 so that circuit terminals 41 adhesively arranged on the surface of the connecting plate 42 are connected with the contacts 13 within the slot 12. Numeral 40 designates sockets mounted on the upper surface of the electronic component testing laminated board 30 and the sockets 40 are connected to the testing circuit pattern 34 through a solder or the like. The electronic components 45, comprising ICs or the like, are connected to the sockets 40 so that the electronic components 45 are connected to the circuit pattern 34 and the signal input and output connector unit 11 through the sockets 40. The electronic component mounting surface of the electronic component testing laminated board 30 which is horizontally mounted on the supporting means, faces the cover member 2 so that when the cover member 2 is opened, the whole component mounting surface is opened upward and the measuring operation opening 50 is defined.

Figure 20:
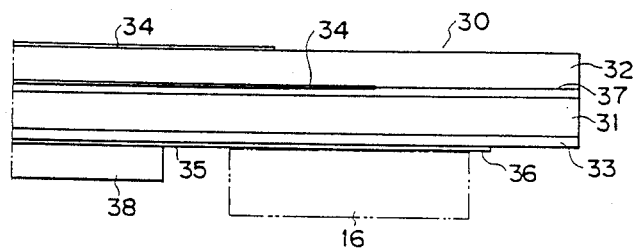
FIG. 20 is a partial enlarged sectional view of the electronic component testing laminated board.

Next, the construction of the electronic component heat testing laminated board 30 of this embodiment will be described. As shown in FIG. 20, the electronic component testing laminated board 30 comprises a metal plate 31 made for example of aluminum having a good heat conductivity, a printed wiring board 32 having a testing circuit pattern 34 on both sides and bonded to the surface of the metal plate 31 through an electric insulating layer 37, and a heater circuit pattern 35 bonded to the back of the metal plate 31 through an electric insulating layer 33. The heater circuit pattern 35 is covered with a protective layer 38 which in turn is removed at the portion of the connecting plate 41 to expose terminals 36 of the heater circuit pattern 36 and a commercial power supply is connected to the terminals 36.

Figure 21:
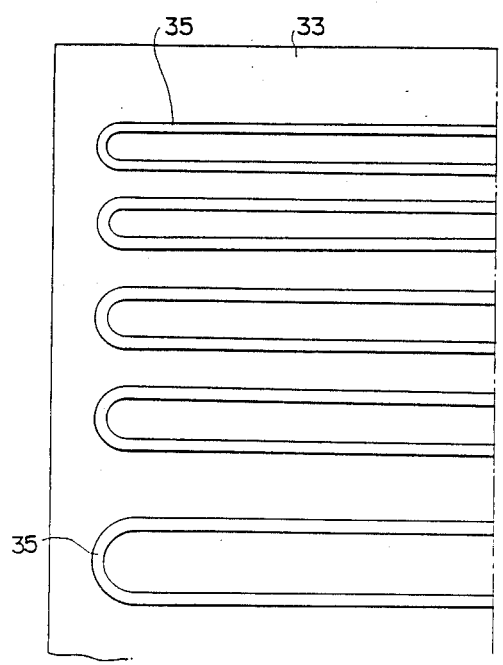
FIG. 21 is a partial enlarged plan view of the heater circuit pattern.

In the electronic component testing laminated board 30 of FIG. 20, the supply of a current to the heater circuit pattern 35 produces a joule heat so that the highly heat conductive metal plate 31 is heated by the generated heat and the heat is dispersed uniformly by the metal plate 31. Thus, the testing circuit pattern 34 formed on the surface of the metal plate 31 is heated uniformly and also the sockets 40 and the electronic components 45 connected to the circuit pattern 34 are heated uniformly. At the same time, the closed space of the portable closed box 1, which is occupied by the electronic component testing laminated board 30, is heated uniformly. To detect the temperature in the closed space, a connector 9 for a temperature sensor 10 is arranged at a suitable place of the box 1 and the temperature sensor 10 is mounted inside the box 1. As shown in FIG. 21, the heater circuit pattern 35 is wired in a zigzag fashion so as to be closely spaced at the ends and coarsely spaced in the intermediary portion.

A connector 8 for commercial power supply connecting purposes is arranged at a suitable portion of the portable closed box 1 as a means of supplying a current to the heater circuit pattern 35 of the electronic component testing laminated board 30. For instance, the connector 8 is provided on any of the side panels other than the front panel forming the cover member 2 and it is externally connected by a plug to the commercial power supply. The connector 8 and the heater circuit pattern 35 are connected directly by leads or alternatively they are connected through switch means so as to be connected and disconnected. In order to permit its removal from the box 1, the electronic component testing laminated board 30 is connected to the connector 8 through the switch means.

Figure 16A:
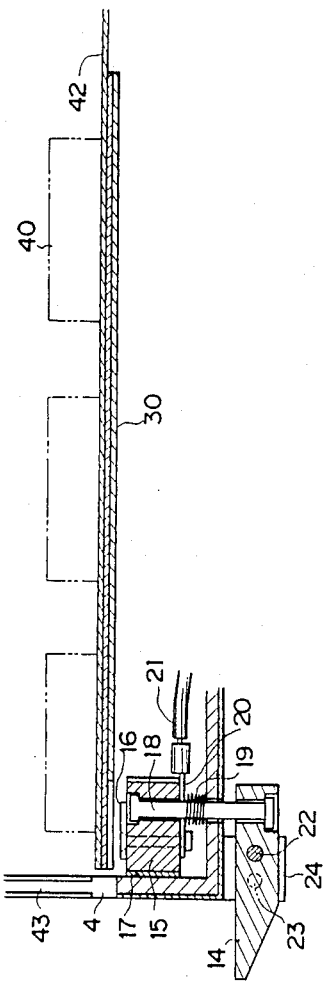
FIG. 16A is a sectional view showing the structure of the switch mounted on the box in the closed position.
Figure 16B:
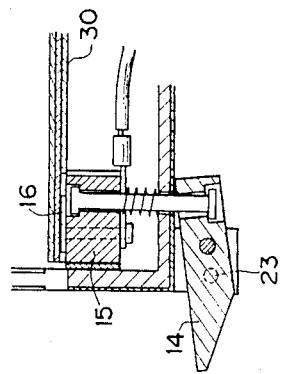
FIG. 16B is a sectional view showing the structure of the switch in its open position.

The switch means is arranged in a suitable place of the box 1, e.g., in the vicinity of the connector 8. FIGS. 13 and 16 show an example of the switch means. As shown in the Figures, a switch lever 14 is mounted on a mounting piece 24 so as to be turned about a pin 22 serving as a fulcrum, while on the other hand, a movable block 15 having armatures 16 on the surface and made of an insulating material is arranged within the box 1 and the block 15 is positioned lower than the connecting plate 42 of the electronic component testing laminated board 30 in such a manner that the armatures 16 face the terminals 36 of the heater circuit pattern 35 and terminals 17 and 20 of the armatures 16 of the movable block 15 are connected to the terminals 36 of the heater circuit pattern 35 by leads 21. The movable block 15 is springly supported by a spring 19 so as to bias the armatures 16 in a direction tending to contact with the heater circuit terminals 36 and the movable block 15 is coupled to the free end of the switch lever 14 by a connecting member 18. Thus, when the lever 14 is turned in one direction as shown in FIG. 16A, the movable block 15 is lowered through the connecting member 18 against the spring 19 and the armatures 16 and the heater circuit terminals 36 are separated (the contact is released), whereas when the switch lever 14 is turned in the other direction in conformity with the spring 19 as shown in FIG. 16B, the movable block 15 is raised by the spring force of the spring 19 and the armatures 16 are brought into contact with the heater circuit terminals 36. Means for holding the switch lever 14 in these operated positions may for example be means for selectively bringing a ball 23 which is springly supported by a spring into engagement with two holes.

By virtue of the provision of this switch means, with the plug inserted in the connector 8 for commercial power supply connecting purposes, the current supply from the commercial power supply to the heater circuit pattern 35 can be turned on and off and also the electronic component testing laminated board 30 can be removed from the box 1 for change with another laminated board. To remove the electronic component testing laminated board 30, after the cover member 2 has been opened and the gate plate 3 has been removed from the guide rails 43 as shown in FIG. 13, the electronic component testing laminated board 30 is sled along the guide rails 6 and withdrawn through the insertion openings 4.

Figure 18:
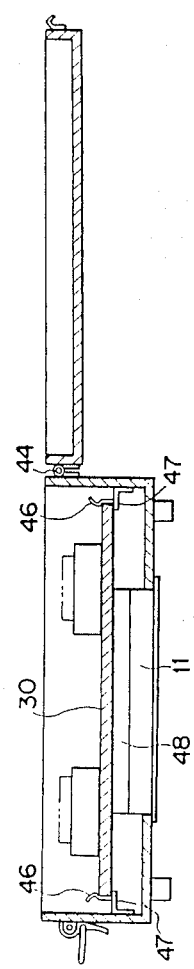
FIG. 18 is a cross-sectional view of the box showing another example concerning the supporting means of the electronic component testing laminated board.
Figure 19:
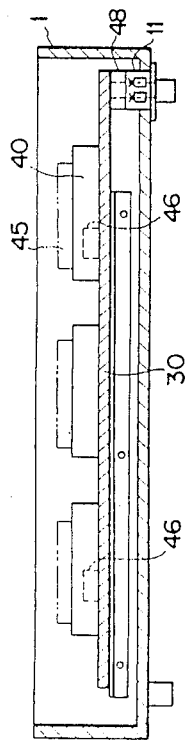
FIG. 19 is a longitudinal sectional view of FIG. 18.

FIGS. 18 and 19 show a case where the measuring operation opening 50 formed by the opening of the cover member 2 is utilized as a means for removably mounting the electronic component testing laminated board 30 inside the box 1.

As shown in the Figures, a pair of laminated board supporting seats 47 are respectively arranged along a pair of the opposing side walls to accommodate the electronic component testing laminated board 30 through the measuring operation opening 50 and horizontally mount on the supporting seats 47, and also means of engaging with the edges of the electronic component testing laminated board 30, such as, the illustrated elastic stop pieces 46 are arranged at the suitable places of the supporting seats 47. The stop pieces 46 are elastically deformed backward when the electronic component testing laminated board 30 is forced into the inner side of the stop pieces 46 and they are restored forward into engagement with the laminated edges when the laminated board 30 is placed on the supporting seats 47. Also, by lifting the electronic component testing laminated board 30 against the elasticity of the stop pieces 46, the stop pieces 46 are disengaged thus permitting to remove the electronic component testing laminated board 30 through the measuring operation opening 50.

In this case, the measuring operation opening 50 functions as an opening for the purpose of measuring the electronic components 45 and mounting and demounting the electronic component testing laminated board 30. Also, the electronic components 45 such as ICs can be engaged and disengaged with the sockets 45 through the opening 50.

In the case of the construction adapted to mount the electronic component testing laminated board 30 through the measuring operation opening 50, a connector unit 48 is attached to the lower surface of the connecting plate 42 of the electronic component testing laminated board 30 and the signal input and output connector unit 11 is attached to the back panel opposing the cover member 2 of the box 1 so as to be opposite to the connector unit 48. The connector units 48 and 11 are coupled to each other when the electronic component testing laminated board 30 is inserted through the measuring operation opening 50 and supported on the supporting seats 47.

Also, in order to permit the cover member 2 to be separated from the box proper, as shown in FIG. 13, a cover locking member 7, e.g., a snap lock is provided on the opening edges of the cover member 2 and the box 1 to close the measuring operation opening 50 and thereby maintain the closed condition.

Figure 17:
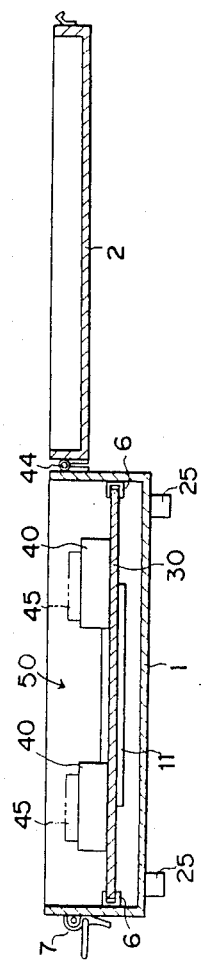
FIG. 17 is a sectional view of the box showing another example concerning the operating structure of the cover.

Also, as another example, one end of the cover member 2 is attached to the box proper through a hinge 44 or the like for opening and closing as shown in FIGS. 17 and 18 and the free end of the cover member 2 is locked through the locking member 7 such as the snap lock to close the box 1.

It is to be noted that while the single electronic component testing laminated board 20 is mounted inside the box 1 in the above-described illustrative embodiment, two or more boards may be mounted side by side within the box. Also, in accordance with the invention the laminated board 30 may be horizontally mounted and supported in the hollow portion of the cover member 2 in the same manner as mentioned previously so that the laminated board 30 is released along with the cover member 2 when the latter is opened.

For instance, an electronic component testing laminated board 30 is mounted inside the box proper in the previously mentioned manner and simultaneously another electronic component testing laminated board 30 is mounted inside the cover member 2 so that when the cover member 2 is opened, the two laminated boards are arranged parallelly in a vertically spaced relation in the closed space of the box 1.

Then, when the portable closed box 1 is arranged on the desk top or the like in a raised manner by the standoffs 25, the electronic component testing laminated board 30 horizontally supported within the box 1 is held in a horizontal position so that when the commercial power supply is connected to the connector 8 and the switch means is closed, a current is supplied to the heater circuit pattern 35 and the closed space of the box 1 and the electronic components 45 mounted on the laminated board 30 are heated. When a given temperature is reached, signals are inputted and outputted through the contacts 13 of the signal input and output connector unit 11 thereby performing various checks and measuring tests on the electronic components 45. In addition, when a given heated temperature, the cover member 2 is opened to open the electronic component mounting surface of the electronic component testing laminated board 30 and test sensing probes are inserted through the measuring operation opening 50 formed by the opening of the cover member 2 so as to contact with the respective terminals of the sockets 40, thereby performing various checks and measuring tests on the electronic components.

Since the heated temperature is decreased by the opening of the cover member 2, after the expiration of a given time the cover member 2 is again closed and the cover member 2 is opened again upon a temperature rise, thus continuing the same measuring tests. After the measurements have been completed, another electronic components are mounted on the sockets 40 through the measuring operation opening 50, thereby repeating the same tests as mentioned previously.

By accommodating the electronic component testing laminated board of this invention in the above-described portable closed box, it is possible to grip the handle of the box to move it freely to a testing site so that by connecting the nearby commercial power supply to the connector provided on the box, the desired testing operation can be readily performed and therefore the tests can be performed at any placed where the commercial power supply is available without any restriction to testing places, that is, irrespective of laboratories, development rooms, office rooms, etc.

For instance, the testing operation can be performed by placing the box on the desk top by the standoffs so that when the box is placed on the desk top or the like, the electronic component testing laminated board is rested in a horizontal position by the standoffs and the board is placed in a condition suited for the heat test.

Also, when the electronic component testing laminated board is horizontally positioned within the closed space of the box and subjected to the heat test, the cover member arranged in opposition to the electronic component testing laminated board is placed on the upper surface side of the box so that in this heated condition the cover member is immediately opened to uncover the electronic component mounting surface of the electronic component testing laminated board and thereby conveniently perform the desired measurements and checks on the electronic components. In other words, by opening the cover member, a measuring opening is formed on the upper surface side of the box placed in position by the standoffs so that the space above the electronic component mounting surface is uncovered and the electronic components are measured easily from above.

Also, the measured electronic components can be demounted and mounted from above through the measuring operation opening and electronic components to be measured newly can be mounted on the electronic component testing laminated board through the measuring operation opening.

Since the box of this embodiment is adopted to measure a limited number of electronic components within the closed space of a limited volume, the commercial power supply can be connected to the box through the connector to raise the temperature within the closed space to a desired value efficiently in a short period of time, and during the unoperated period the power supply is disconnected to prevent any operation loss.

By using the above-mentioned box, it is possible to keep the box about oneself so that when occasion demands, the commercial power supply can be used at any time to readily perform the heat test and the that test can be performed efficiently on a limited number of electronic components such as the previously mentioned ASICs.

EMBODIMENT 5

Figure 22A:
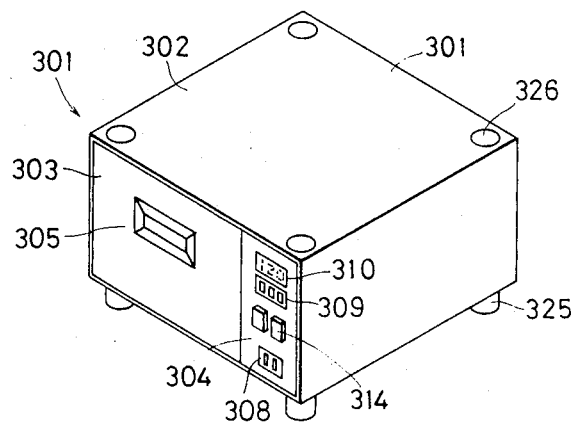
FIG. 22A is a perspective view showing another example of the box for, accommodating the electronic component testing laminated board.

FIG. 22A shows another embodiment of the invention in which the electronic component testing laminated board of this invention is accommodated in a small box which is different from the fourth embodiment.

A small box 301, which is used in this embodiment, includes a standoff 325 at each of the four corners of the bottom surface, and a standoff fixing hole 326 at each of the four corners of the upper surface so as to removably insert one of the standoff 325, and partition walls are made of a heat insulating material.

Also, a front panel 303 is adapted for opening and closing so that when a pull 305 is pulled toward one's side, the panel 303 falls toward oneself by pivoting on a hinge (not shown) provided at the lower end thereof thereby forming an opening. At this time, the panel 303 forms in effect an extension from the bottom surface of the box 301 and thus it can also be uses as a simple workbench during the measuring operation or the changing operation of electronic components.

In the like manner as described in connection with the fourth embodiment, disposed inside the box 301 is supporting means for horizontally supporting an electronic component testing laminated board so that with the panel 303 in the open position, the electronic component testing laminated board is inserted and supported on the supporting means. Also, disposed on the back panel opposing the panel 303 is connector means (not shown) for effecting the inputting and outputting of signals between it and the testing circuit pattern of the testing laminated board, and the terminal section of the laminated board is fitted in the connector means. The inputting and outputting of signals from the testing circuit pattern can also be effected by bringing the leads directly soldered to the terminal section of the testing circuit pattern to the outside through the small holes formed in the wall surface of the box 301.

Also, a control panel 304 is arranged in the adjoining portion to the panel 303 of the box 301 and the control panel 304 includes connector 308 and an on-off switch 314 for supplying a current to the heater circuit pattern. In addition, the control panel 304 includes temperature setting adjuster 309 for setting the internal temperature of the box 1 to a desired value, and temperature indicator 310 for digitally indicating the internal temperature of the box which is measure by a temperature sensor.

To perform the burn-in test by using this box 301, after a testing laminated board having electronic components mounted thereon has been placed within the box 301, th panel 303 is closed and the temperature setting adjuster 309 is set to a test temperature. Then, when the on-off switch 314 is turned on thus starting the supply of current to the heater circuit pattern, the temperature of the testing laminated board carrying the electronic components and the temperature of the air inside the box are raised and air temperature is indicated by the temperature indicator 310. In this embodiment, the current supply to the heater circuit pattern is automatically controlled such that the internal temperature of the box coincides with the set temperature.

Figure 22B:
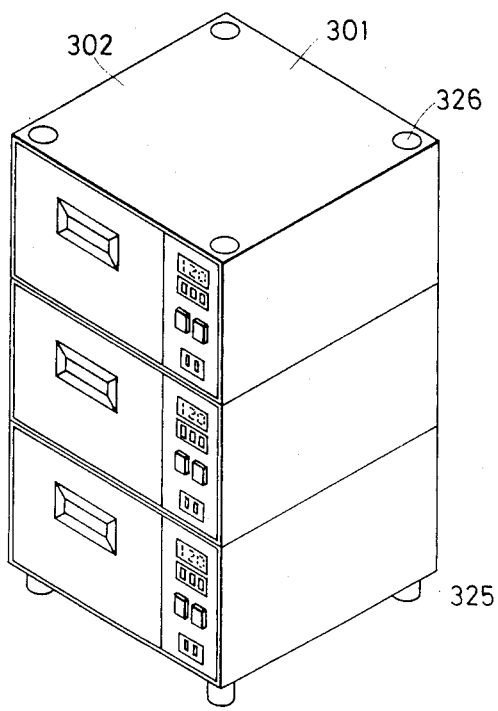
FIG. 22B is a perspective vie showing the condition in which a plurality of units of the box are stacked one upon another.

The above-described box 301 may be used singly as shown in FIG. 22A or alternatively a plurality of the boxes 301 may be used in stacked form by inserting the standoffs 325 into the corresponding standoff fixing holes 326 as shown in FIG. 22B. By so doing, the desired tests can be performed very deftly in cases where different kinds of electronic components are tested, where the test contents are divided into several classes and so on. Also, even when no test is performed, the boxes 301 can be stored in a testing laboratory in an orderly way.

What is claimed is:

1. A laminated board for testing electronic components comprising:
   a metal plate;
   a testing circuit layer integrally formed through a first electric insulting layer on one side of said metal plate for mounting thereon electronic components to be tested; and
   a heater circuit layer integrally formed through a second electric insulating layer on the other side of said metal plate, said second electric insulating layer transmitting heat generated by said heater circuit layer to said testing circuit layer for maintaining said testing circuit layer at a predetermined temperature.

2. A laminated board according to claim 1, wherein said metal plate in made from aluminum.

3. A laminated board according to claim 1, wherein said metal plate is made from iron.

4. A laminated board according to claim 1, wherein the thickness of said metal plate is 1 to 2 mm.

5. A laminated board according to claim 1, wherein said testing circuit layer comprises a multi-layer printed wiring board including a pair of metal foil circuit layers electrically connected each other by a metal plated-through hole.

6. A laminated board according to claim 1, wherein said testing circuit layer consists of a single layer of metal foil circuit.

7. A laminated board according to claim 1, wherein said heater circuit layer consists of a single layer of metal foil circuit.

8. A laminated board according to claims 6, wherein said metal foil circuit is formed by etching a metal foil laminated to said metal plate through an electric insulating layer.

9. A laminated board according to claims 5, wherein said metal foil circuit is a copper foil circuit.

10. A laminated board according to claims 5, wherein said metal foil circuit is a nickel foil circuit.

11. A laminated board according to claim 1, wherein said testing circuit layer comprises a circuit formed by using a conductive paste.

12. A laminated board according to claim 1, wherein said heater circuit layer comprises a circuit formed by using a conductive paste.

13. A laminated board according to claim 1, wherein said heater circuit layer comprises a conductor pattern formed in a zigzag pattern.

14. A laminated board according to claim 1, wherein each of said first and second electric insulating layers is made of at least one material selected from a group consisting of epoxy resin, polybutadien resin, polyimide resin, bismaleimide triazine resin and fluoroplastic.

15. A laminated board according to claim 1, wherein each of said first and second electric insulating layers is reinforced by a glass cloth.

16. A laminated board according to claim 1, wherein an inorganic filler is added to each of said first and second electric insulating layers.

17. A laminated board according to claim 1, wherein the thickness of each of said first and second electric insulating layers is 60 to 150 $\mu$m.

18. A laminated board according to claim 1, wherein a shielding layer is laminated to an outer side of said heater circuit layer through an electric insulating layer to shield an electromagnetic noise from said heater circuit layer.

19. A laminated board according to claim 18, wherein said shielding layer and said metal plate are conductively connected.

20. A laminated board according to claim 19, wherein said shielding layer and said metal plate are conductively connected by a screw extend through said laminated board.

21. A laminated board according to claim 19, wherein said shielding layer and said metal plate are conductively connected by a substantially E-shaped member fitted on one end of said laminated board.

22. A laminated board according to claim 5, wherein an electric insulating layer of substantially the same thickness as the printed wiring board forming said testing circuit layer is laminated to an outer side of said heater circuit layer.

23. A laminated board according to claim 18, wherein said shielding layer comprises a metal foil.

24. A laminated board according to claim 18, wherein said shielding layer comprises a coating layer of conductive paste.

25. A laminated board according to claim 1, wherein said testing circuit layer is provided with sockets for detachably mounting electronic components.

26. An electronic component testing box comprising box means having a tightly-closable opening for removably accommodating an electronic component testing laminated board including a metal plate, a testing circuit layer integrally formed through an electric insulating layer on one side of said metal plate for mounting thereon electronic components to be tested, and a heater circuit layer integrally formed through another electric insulating layer on the other side of said metal plate, said second electric insulating layer transmitting heat generated by said heater circuit layer to said testing circuit layer for maintaining said testing circuit layer at a predetermined temperature.

27. A testing according to claim 26, wherein walls said box means are made of a heat insulating material.

28. A testing box according to claim 26, further comprising supporting means for removably horizontally mounting said electronic component testing laminated board.

29. A testing box according to claim 26, further comprising power supply connecting connector means connected to the heater circuit layer of said electronic component testing laminated board.

30. A testing box according to claim 26, further comprising signal input and output connector means connected to the testing circuit layer of said electronic components testing laminated board.

31. A testing box according to claim 26, further comprising standoffs for maintaining said box means in a raised position.

32. A testing box according to claim 26, further comprising temperature measuring means for measuring an internal temperature of said box means.

33. A testing box according to claim 26, further comprising a handle for carrying said box means.

* * * * *